United States Patent
Hsu et al.

(10) Patent No.: US 9,530,655 B2
(45) Date of Patent: Dec. 27, 2016

(54) SLURRY COMPOSITION FOR CHEMICAL MECHANICAL POLISHING OF GE-BASED MATERIALS AND DEVICES

(71) Applicants: TAIWAN SEMICONDUCTOR MANUFACTURING COMPANY, LTD., Hsin-Chu (TW); UWIZ TECHNOLOGY CO., LTD., Zhongli, Taoyuan (TW)

(72) Inventors: Chia-Jung Hsu, Dacheng Township, Changhua County (TW); Yun-Lung Ho, Miaoli (TW); Neng-Kuo Chen, Hsinchu (TW); Song-Yuan Chang, Zhongli (TW); Teng-Chun Tsai, Hsinchu (TW)

(73) Assignees: Taiwan Semiconductor Manufacting Company, Ltd., Hsin-Chu (TW); UWIZ Technology Co., Ltd., Taoyuan, Taiwan (CN)

( * ) Notice: Subject to any disclaimer, the term of this patent is extended or adjusted under 35 U.S.C. 154(b) by 0 days.

(21) Appl. No.: 14/480,046

(22) Filed: Sep. 8, 2014

(65) Prior Publication Data

US 2016/0071737 A1 Mar. 10, 2016

(51) Int. Cl.
*H01L 21/302* (2006.01)
*H01L 21/306* (2006.01)
(Continued)

(52) U.S. Cl.
CPC ....... *H01L 21/30625* (2013.01); *B24B 37/044* (2013.01); *C09G 1/02* (2013.01); *C09G 1/04* (2013.01); *C09K 3/1463* (2013.01); *H01L 21/0245* (2013.01); *H01L 21/02381* (2013.01); *H01L 21/3212* (2013.01); *H01L 21/67075* (2013.01); *H01L 29/66795* (2013.01); *H01L 29/78684* (2013.01)

(58) Field of Classification Search
None
See application file for complete search history.

(56) References Cited

U.S. PATENT DOCUMENTS

2010/0012976 A1* 1/2010 Hydrick ............ H01L 21/02057
257/190

OTHER PUBLICATIONS

Chia-Jung Hsu, Yun-Lung Ho, Neng-Kuo Chen, Wen-Feng Chueh, Sey-Ping Sun and Song-Yuan Chang, "Chemical Mechanical Polishing Method Using Slurry Composition Containing N-Oxide Compound," U.S. Appl. No. 14/078,797, filed Nov. 13, 2013; 27 Pages.

* cited by examiner

*Primary Examiner* — Jiong-Ping Lu
(74) *Attorney, Agent, or Firm* — Haynes and Boone, LLP

(57) ABSTRACT

A CMP slurry composition which provides for a high Ge- or SiGe-to-dielectric material selectivity a low rate of Ge or SiGe recess formation includes an oxidant and a germanium removal rate enhancer including at least one of a methylpyridine compound and a methylpyridine derivative compound. In some examples, the slurry composition also includes an etching inhibitor. In some cases, the slurry composition may include an abrasive, a surfactant, an organic complexant, a chelating agent, an organic or inorganic acid, an organic or inorganic base, a corrosion inhibitor, or a buffer. The slurry composition may be distributed onto a surface of a polishing pad disposed on a platen that is configured to rotate. Additionally, a workpiece carrier configured to house a substrate may bring the substrate into contact with the rotating polishing pad and thereby polish the substrate utilizing the slurry composition.

20 Claims, 13 Drawing Sheets

(51) Int. Cl.
*H01L 29/66* (2006.01)
*C09G 1/04* (2006.01)
*C09G 1/02* (2006.01)
*B24B 37/04* (2012.01)
*H01L 21/02* (2006.01)
*H01L 21/321* (2006.01)
*H01L 21/67* (2006.01)
*H01L 29/786* (2006.01)
*C09K 3/14* (2006.01)

| Example | 500 ppm Ge Rate Enhancer ||| 2,000 ppm Ge Rate Enhancer |||
|---|---|---|---|---|---|---|
| Ge Rate Enhancer | Ge R.R. (A/min) | Oxide R.R. (A/min) | Ge R.R. Improvement (%) | Ge R.R. (A/min) | Oxide R.R. (A/min) | Ge R.R. Improvement (%) |
| Control | None | 2200 | 80 | N/A | 2200 | 80 | N/A |
| Example 1 | 2-methylpyridine | 3332 | 95 | 51% | 3521 | 96 | 60% |
| Example 2 | 3-methylpyridine | 2354 | 97 | 7% | 2398 | 94 | 9% |
| Example 3 | 4-methylpyridine | 3478 | 96 | 58% | 3564 | 97 | 62% |
| Example 4 | 2,3-dimethylpyridine | 3212 | 90 | 46% | 3366 | 93 | 53% |
| Example 5 | 2,4-dimethylpyridine | 3388 | 91 | 54% | 3674 | 89 | 67% |
| Example 6 | 2,6-dimethylpyridine | 3366 | 92 | 53% | 3564 | 88 | 62% |
| Example 7 | 3,5-dimethylpyridine | 2310 | 91 | 5% | 2354 | 90 | 7% |

FIG. 4

| Example | Etching inhibitor | Oxidant | Ge R.R. (A/min) | Oxide R.R. (A/min) | Ge/oxide selectivity | Recess (Angstrom) | Remark |
|---|---|---|---|---|---|---|---|
| Control | None | $H_2O_2$ | 2200 | 80 | 27.5 | 835 | No Ge removeal rate enhancer |
| Example 1 | 2-mercaptopyridine N-oxide | $H_2O_2$ | 1845 | 28 | 65 | 100 | No Ge removeal rate enhancer |
| Example 2 | 2-mercaptopyridine N-oxide | $H_2O_2$ | 3044 | 50 | 60 | 95 | 2,000 ppm of 2-methylpyridine |

FIG. 5

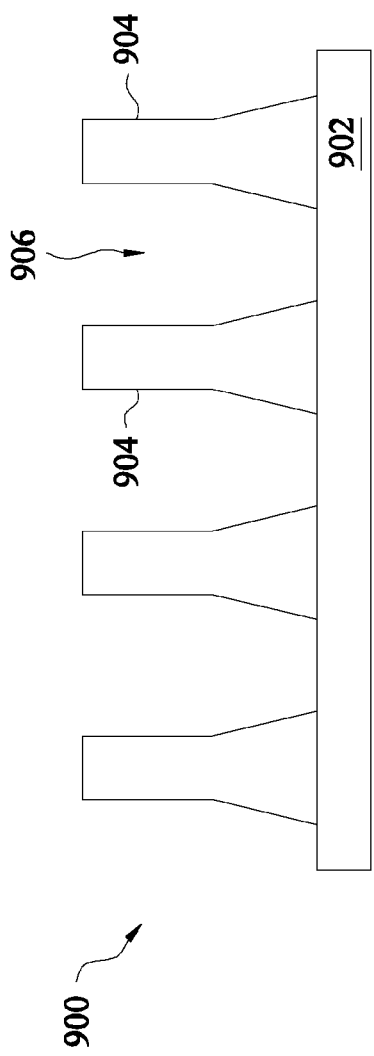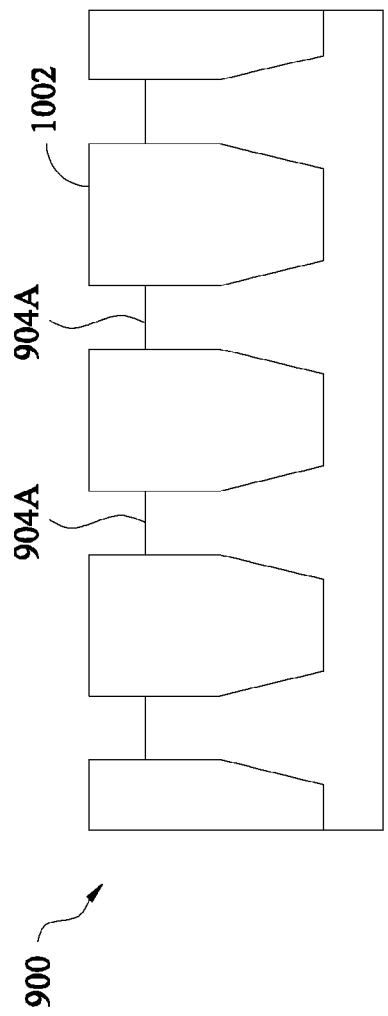

SLURRY COMPOSITION FOR CHEMICAL MECHANICAL POLISHING OF GE-BASED MATERIALS AND DEVICES

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

A particular challenge, and one which has become increasingly difficult for reduced device geometries, relates to the substrate planarization requirements during device fabrication. To meet such requirements, chemical mechanical polishing (CMP) is a process that has been introduced and used throughout the semiconductor industry, and which continues to be developed. In a conventional CMP process, a substrate surface is acted upon by a slurry and a polishing pad. By way of example, a force may be applied to press the substrate against the pad while the substrate and the pad are rotated. The rotation and the substrate-to-pad force, in conjunction with the slurry supplied to the substrate, serve to remove substrate material and thus planarize a surface of the substrate. In general, a CMP process should be optimized for specific process conditions such as the material being polished, device structure, desired etch rate, etc. With the continued advancement of highly-scaled IC technology, bringing with it new materials and new device structures, optimization of CMP processes not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 illustrates a table of some embodiments of slurry compositions which include a Ge removal rate enhancer;

FIG. 5 illustrates a table of some embodiments of slurry compositions which include a Ge removal rate enhancer and an etching inhibitor;

FIGS. 9-13 illustrate cross-section views of an embodiment of a semiconductor device at various stages of the method of FIG. 8.

DETAILED DESCRIPTION

Figure 1A:
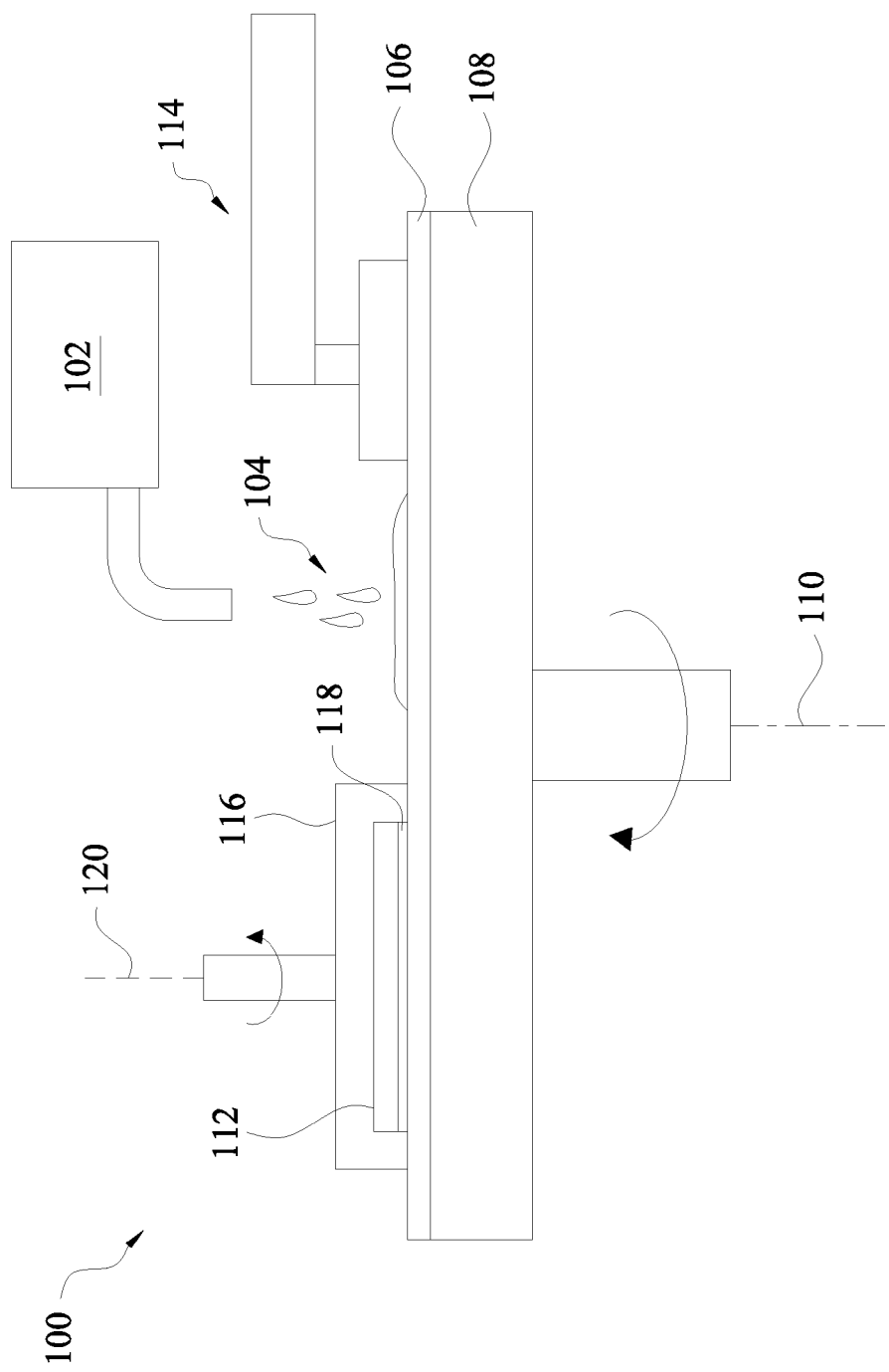
FIG. 1A illustrates a chemical mechanical polishing (CMP) system according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments of chemical mechanical polishing (CMP) processes, including CMP slurries, useful for the fabrication of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other examples of semiconductor devices that may benefit from aspects of the present disclosure. For example, some embodiments as described herein may also be applied to planar transistors, gate-all-around (GAA) devices, Omega-gate (Ω-gate) devices, or Pi-gate (Π-gate) devices. While the CMP slurries and processes are described herein with reference to multi-gate or FinFET devices, it will be understood that the slurries and processes described herein are not limited to such devices and may be equally applied to the fabrication of other devices (e.g., planar CMOS devices) without departing from the scope of the present disclosure.

As semiconductor device sizes continue to shrink, it has become increasingly difficult to meet device planarization requirements in fabrication. For example, the formation of fin elements as part of a FinFET device fabrication process generally requires a planarization step. In particular, CMP planarization of germanium (Ge) or silicon germanium (SiGe) has introduced new challenges to FinFET fabrication. Traditionally, the CMP planarization step used for example in the formation of Ge or SiGe fin elements (e.g., for a FinFET device), may use a slurry comprising hydrogen peroxide. As used herein, a "slurry" includes an aqueous mixture having a chemical composition that may enhance, reduce, or otherwise modify a substrate polishing rate. In some cases, slurries may also contain abrasive particles. In various examples, traditional hydrogen peroxide slurries may provide a desirable, high germanium-to-oxide selectivity (i.e., preferential removal of germanium instead of oxide). However, such slurries may also excessively recess the germanium fin elements, which may include channel regions of a FinFET device, and which can thus negatively impact device performance. Therefore, a CMP process that uses a slurry having a high germanium-to-oxide selectivity, as well as a low rate of germanium recess formation, is desirable for the successful implementation of Ge- or SiGe-based FinFET devices.

According to various aspects of the present disclosure, an improved CMP slurry composition is disclosed, which provides for a high Ge- or SiGe-to-dielectric material selectivity along with a low rate of Ge or SiGe recess formation. In some embodiments, the disclosed slurry composition includes an oxidant and a Ge removal rate enhancer. In some embodiments, the oxidant includes a compound having one or more oxygen molecules. In some embodiments, the Ge removal rate enhancer includes a methylpyridine compound or a methylpyridine derivative compound. In the various embodiments described herein, the slurry compositions including the Ge removal rate enhancer provides a high polishing throughput (e.g., via high Ge or SiGe removal), a low rate of Ge or SiGe recess formation, and an enhanced pot-life (i.e., time period during which the slurry composition retains its efficacy). While a few advantages of certain embodiments described herein have been described, those skilled in the art will readily recognize other advantages of using one or more of the present embodiments.

Referring to the example of FIG. 1A, a chemical mechanical polishing (CMP) system 100 is illustrated. The CMP system 100 includes a slurry source 102 configured to distribute a slurry 104 onto a surface of a polishing pad 106. As shown in FIG. 1A, the polishing pad 106 is disposed on a platen 108, which rotates the polishing pad 106 about an axis of rotation 110 during operation of the CMP system 100. The rotation of the polishing pad 106 transports the slurry 104 underneath a semiconductor substrate 112. Thus, the polishing pad 106, in conjunction with the slurry 104, serves to polish the substrate 112. A pad conditioner 114, which may include a diamond grit conditioning pad, is configured to push on the polishing pad 106 with a downward force such that the diamond grit is brought into contact with the polishing pad 106. As the polishing pad 106 is rotated by the platen 108, the diamond grit roughens the surface of the polishing pad 106 to provide for improved mechanical polishing. It is noted that this description of FIG. 1A is exemplary only and it should be understood that other embodiments of a CMP system and removal mechanism are within the scope of the present disclosure.

The CMP system 100 further includes a workpiece carrier 116 that is configured to house the substrate 112 during the CMP process. In various embodiments, the substrate 112 is positioned in an upside down orientation within the workpiece carrier 116 so that a top surface of the substrate 112 faces the polishing pad 106. By way of example, the workpiece carrier 116 is operable to bring the substrate 112 into contact with the polishing pad 106, for example, such that the top surface of the substrate 112 contacts the polishing pad 106 while the polishing pad 106 rotates. By bringing the semiconductor substrate 112 into contact with the rotating polishing pad 106, polishing of the substrate 112 is achieved. Additionally, in some embodiments, the workpiece carrier 116 may also be rotated during operation of the CMP system 100 for example, about an axis of rotation 120.

In various embodiments, the substrate 112 may include one or more layers 118 to be polished, such as a dielectric material layer (e.g., oxide), a metal layer, a semiconductor layer (e.g., silicon, germanium, a III-V semiconductor material), or a combination thereof. The one or more layers 118 include an interface that directly faces the rotating polishing pad 106. In some embodiments, the one or more layers 118 includes germanium (Ge) or $Si_{(1-x)}Ge_x$, where 'x' includes values from around 15% to around 100%. Thus, in some embodiments, the layer 118 may include a SiGe layer with around 15% Ge, a SiGe layer with around 100% Ge (i.e., pure Ge), or a SiGe layer having any Ge concentration between 15-100%. In some examples, the one or more layers 118 may include other materials (e.g., copper, aluminum, dielectrics, etc.). By way of example, in some embodiments, the layer 118 includes a dielectric material layer such as silicon dioxide. In various embodiments, such as when Ge or SiGe fin elements are being formed (e.g., as part of FinFET device fabrication), as described below, the one or more layers 118 may include a Ge or SiGe layer as well as a dielectric layer (e.g., a shallow trench isolation oxide layer). In such embodiments, the CMP system 100 is configured to polish the Ge or SiGe layer, of the layer 118, with a high Ge- or SiGe-to-dielectric material selectivity along with a low rate of Ge or SiGe recess formation.

Figure 1B:
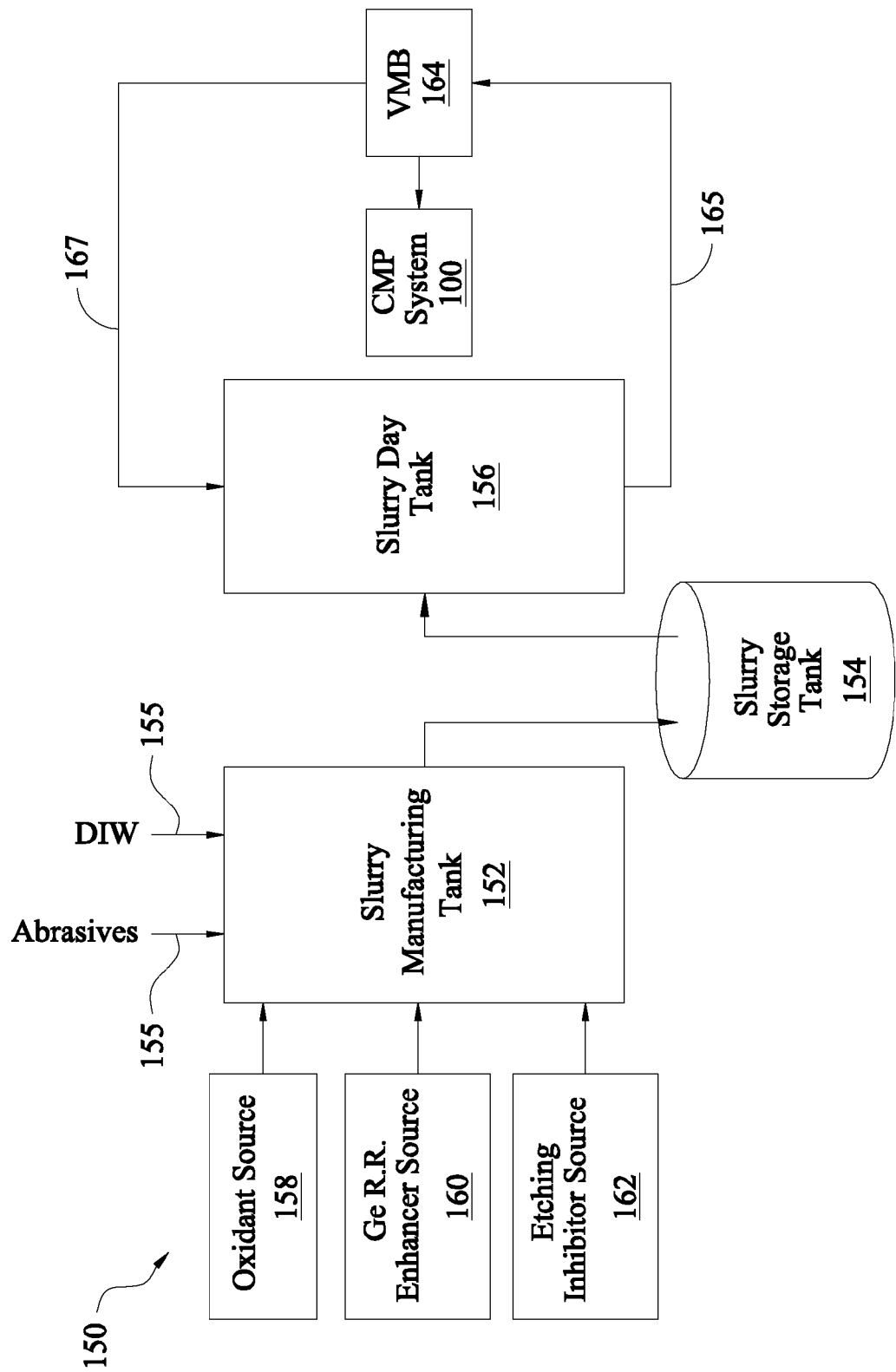
FIG. 1B illustrates a CMP slurry manufacturing and delivery system according to one or more aspects of the present disclosure.

In some embodiments, the CMP system 100 may be implemented within a CMP slurry manufacturing and delivery system 150, as illustrated in FIG. 1B. As shown, the CMP slurry manufacturing and delivery system 150 may include a slurry manufacturing tank 152, one or more slurry storage tanks 154, a slurry day tank 156, an oxidant source 158, a Ge removal rate (R.R.) enhancer source 160, an etching inhibitor source 162, and/or other components as known in the art. In some embodiments, the slurry manufacturing tank 152 is coupled to the oxidant source 158, the Ge removal rate enhancer source 160, and to the etching inhibitor source 162. In various embodiments, the oxidant source 158 is configured to provide an oxidant to the slurry manufacturing tank 152. In some embodiments, the oxidant provided by the oxidant source 158 may include a compound having one or more oxygen molecules such as hydrogen peroxide, or others as described below. In various embodiments, the Ge R.R. enhancer source 160 is configured to provide a Ge removal rate enhancer to the slurry manufacturing tank 152. By way of example, in some embodiments, the Ge removal rate enhancer provided by the Ge R.R. enhancer source 160 may include a methylpyridine compound or a methylpyridine derivative compound as described below. In some embodiments, the etching inhibitor source 162 is configured to provide an etching inhibitor to the slurry manufacturing tank 152. For example, in some embodiments, the etching inhibitor provided by the etching inhibitor source 162 includes 2-mercaptopyridine N-oxide, or others as known in the art. In some embodiments, the slurry manufacturing tank 152 may also include one or more inlets 155 configured to provide de-ionized water (DIW) and/or abrasives to the slurry manufacturing tank 152, which are subsequently introduced into the slurry. In some cases, inlets may also be provided to deliver one or more of an organic complexant, a chelating agent, an organic or inorganic acid/base, a corrosion inhibitor, and a buffer.

In some embodiments, the slurry (e.g., stored in the slurry storage tank 154) may be transported into the slurry day tank 156. In some embodiments, the slurry is provided by way of a transport piping 165 from the slurry day tank 156 to one or more valve manifold boxes (VMB) 164. The valve manifold boxes 164 are configured to selectively provide the slurry from the transport piping 165 to the CMP system 100, for example, when the CMP system 100 is operated to perform a chemical mechanical polishing of a substrate. In some embodiments, a re-circulation transport piping 167 is configured to return slurry that has not been provided to the CMP system 100 from the one or more valve manifold boxes 164 to the slurry day tank 156. The slurry day tank 156 is configured to mix the unused slurry with new slurry to maintain a slurry having a high Ge- or SiGe-to oxide selectivity with a low rate of Ge or SiGe recess formation. In various embodiments, the methylpyridine or methylpyridine derivative compounds extend the life of the slurry (e.g., the slurry within the day tank 156). In some examples, the slurry maintains its efficacy for a time period of at least six months.

Returning to the slurry source 102 of FIG. 1A, and the slurry 104 distributed therefrom, the slurry 104 includes an aqueous mixture having a chemical composition that may enhance, reduce, or otherwise modify a polishing rate of the one or more layers 118. In some embodiments, the slurry 104 includes an oxidant (e.g., provided by the oxidant source 158) and a Ge removal rate enhancer (e.g., provided by the Ge R.R. enhancer source 160). In some examples, the oxidant includes a compound having one or more oxygen molecules such as hydrogen peroxide, potassium peroxodisulfate, ammonium peroxodisulfate, sodium peroxodisulfate, potassium peroxymonosulfate, peracetic acid, or tert-butyl hydrogen peroxide. In some embodiments, the Ge removal rate enhancer includes a methylpyridine compound or a methylpyridine derivative compound. By way of the example, the Ge removal rate enhancer may include 2-methylpyridine; 3-methylpyridine; 4-methylpyridine; 2,3-dimethylpyridine; 2,4-dimethylpyridine; 2,6-dimethylpyridine; or 3,5-dimethylpyridine. In some embodiments, the slurry 104 includes an oxidant concentration from about 10 parts per million (ppm) to about 50,000 ppm. In some embodiments, the slurry includes a Ge removal rate enhancer concentration from about 100 ppm to about 5,000 ppm. In some examples, the slurry 104 has a pH value from about 1 to about 6.

It will be appreciated that in some embodiments the disclosed slurry 104 may comprise additional components. For example, in some embodiments, the slurry 104 may include a surfactant (e.g., polyethylene glycol) configured to lower a surface tension of the slurry 104. In other embodiments, the slurry 104 may include abrasive particles that aid in the mechanical polishing of the semiconductor substrate 112. For example, the slurry 104 may include abrasive particles such as colloidal silica, fumed silica, aluminum oxide, silica shell based composite submicron particles, ceria, etc. In other embodiments, the slurry 104 may be abrasive free (i.e., the slurry 104 does not include abrasive particles). In addition, in some embodiments, the slurry 104 may include at least one of organic complexants, chelating agents, organic or inorganic acids/bases, corrosion inhibitors, buffers, and etch inhibitors.

Figure 2A:
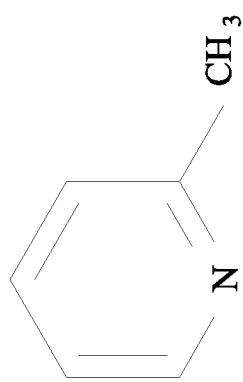
FIGS. 2A-2C illustrate isomers of methylpyridine which may be used as Ge removal rate enhancer within a CMP slurry according to one or more aspects of the present disclosure.
Figure 2B:
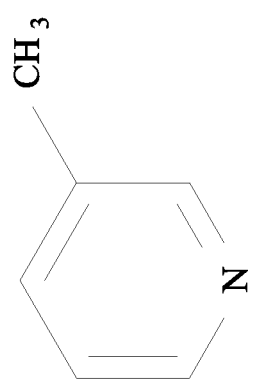
Figure 2C:
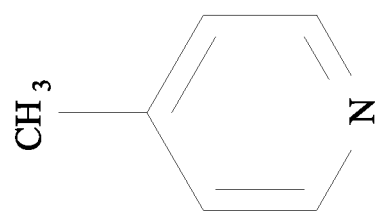
Figure 3A:
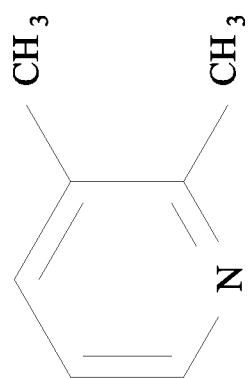
FIGS. 3A-3D illustrate methylpyridine derivative compounds which may be used as a Ge removal rate enhancer within a CMP slurry according to one or more aspects of the present disclosure.
Figure 3B:
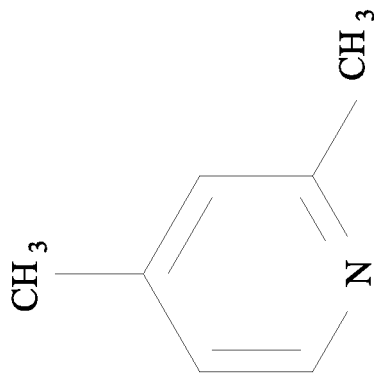
Figure 3C:
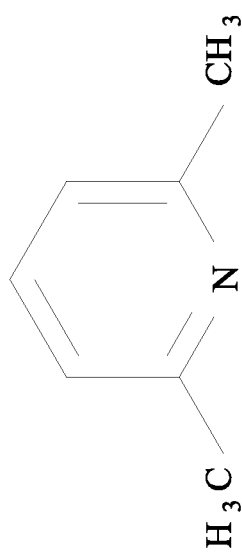
Figure 3D:
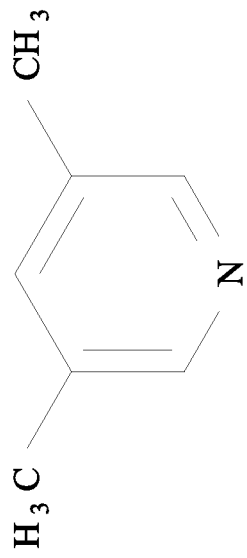

Expanding upon the composition of the slurry 104, and with reference to FIG. 2, some embodiments of methylpyridine compounds used as the Ge removal rate enhancer are illustrated. In particular, FIGS. 2A, 2B, and 2C illustrate three different methylpyridine isomers. FIG. 2A illustrates 2-methylpyridine, also known as 2-picoline and having the chemical formula $C_6H_7N$, which may be combined with one or more of the oxidants discussed above (e.g., hydrogen peroxide, potassium peroxodisulfate, etc.) in an aqueous mixture to form the slurry 104. FIG. 2B illustrates 3-methylpyridine, also known as 3-picoline and having the chemical formula $C_6H_7N$, which may be combined with one or more of the oxidants discussed above in an aqueous mixture to form the slurry 104. FIG. 2C illustrates 4-methylpyridine, also known as 4-picoline and having the chemical formula $C_6H_7N$, which may be combined with one or more of the oxidants discussed above to form the slurry 104.

Further expanding upon the composition of the slurry 104, and with reference to FIG. 3, some embodiments of methylpyridine derivative compounds used as the Ge removal rate enhancer are illustrated. FIG. 3A illustrates 2,3-dimethylpyridine, also known as 2,3-lutidine and having the chemical formula $C_7H_9N$, which may be combined with one or more of the oxidants discussed above to form the slurry 104. FIG. 3B illustrates 2,4-dimethylpyridine, also known as 2,4-lutidine and having the chemical formula $C_7H_9N$, which may be combined with one or more of the oxidants discussed above to form the slurry 104. FIG. 3C illustrates 2,6-dimethylpyridine, also known as 2,6-lutidine and having the chemical formula $C_7H_9N$, which may be combined with one or more of the oxidants discussed above to form the slurry 104. FIG. 3D illustrates 3,5-dimethylpyridine, also known as 3,5-lutidine and having the chemical formula $C_7H_9N$, which may be combined with one or more of the oxidants discussed above to form the slurry 104.

As discussed above, the slurry 104 may include an oxidant concentration in the range of between about 10-50,000 ppm and a Ge removal rate enhancer concentration in the range of between about 100-5,000 ppm. Merely by way of example, some embodiments of the slurry 104 composition include about 2,000 ppm colloidal silica, about 1,000 ppm $H_2O_2$, about 200 ppm polyethylene glycol, about 500 ppm of a methylpyridine compound or a methylpyridine derivative compound (described above), and have a pH level of about 3. In some embodiments, the slurry 104 composition includes about 2,000 ppm colloidal silica, about 1,000 ppm $H_2O_2$, about 200 ppm polyethylene glycol, about 2,000 ppm of a methylpyridine compound or a methylpyridine derivative compound, and have a pH level of about 3.

Referring to FIG. 4, a table 400 shows a germanium removal rate (Ge R.R.) in angstroms per minute (Å/min), an oxide removal rate (Oxide R.R.) in Å/min, and a germanium removal rate improvement percent for embodiments of a slurry 104 composition employing about 500 ppm of a methylpyridine compound or a methylpyridine derivative compound versus embodiments of the slurry 104 composition employing about 2,000 ppm of a methylpyridine compound or a methylpyridine derivative compound. For comparison, the first row of the table 400 shows data for a control slurry composition, which does not include the Ge removal rate enhancer. By way of example, the control slurry composition may include about 2,000 ppm colloidal silica, about 1,000 ppm $H_2O_2$, about 200 ppm polyethylene glycol, and have a pH level of about 3. As shown in the table 400, the control slurry composition has a Ge R.R. of about 2,200 Å/min and an Oxide R.R. of about 80 Å/min.

With reference now to the example slurry 104 compositions having the Ge removal rate enhancer, the second row of the table 400 illustrates a first example (Example 1) which includes 2-methylpyridine as the Ge removal rate enhancer. As shown, the slurry 104 composition with 500 ppm 2-methylpyridine provides for a Ge R.R. of about 3,332 Å/min and an Oxide R.R. of about 95 Å/min, resulting in about a 51% Ge R.R. improvement over the control slurry composition. As also shown, the slurry 104 composition with 2.00 ppm 2-methylpyridine provides for a Ge R.R. of about 3,521 Å/min and an Oxide R.R. of about 96 Å/min, resulting in about a 60% Ge R.R. improvement over the control slurry composition.

As another example, the third row of the table 400 illustrates a second example (Example 2) which includes 3-methylpyridine as the Ge removal rate enhancer. As shown, the slurry 104 composition with 500 ppm 3-methylpyridine provides for a Ge R.R. of about 2,354 Å/min and an Oxide R.R. of about 97 Å/min, resulting in about a 7% Ge R.R. improvement over the control slurry composition. As also shown, the slurry 104 composition with 2.00 ppm 3-methylpyridine provides for a Ge R.R. of about 2,398 Å/min and an Oxide R.R. of about 94 Å/min, resulting in about a 9% Ge R.R. improvement over the control slurry composition.

The fourth row of the table 400 illustrates a third example (Example 3) which includes 4-methylpyridine as the Ge removal rate enhancer. As shown, the slurry 104 composition with 500 ppm 4-methylpyridine provides for a Ge R.R. of about 3,478 Å/min and an Oxide R.R. of about 96 Å/min, resulting in about a 58% Ge R.R. improvement over the control slurry composition. As also shown, the slurry 104 composition with 2.00 ppm 4-methylpyridine provides for a Ge R.R. of about 3,564 Å/min and an Oxide R.R. of about 97 Å/min, resulting in about a 62% Ge R.R. improvement over the control slurry composition.

Continuing with example slurry 104 compositions having the Ge removal rate enhancer, the fifth row of the table 400 illustrates a fourth example (Example 4) which includes 2,3-dimethylpyridine as the Ge removal rate enhancer. As shown, the slurry 104 composition with 500 ppm 2,3-dimethylpyridine provides for a Ge R.R. of about 3,212 Å/min and an Oxide R.R. of about 90 Å/min, resulting in about a 46% Ge R.R. improvement over the control slurry composition. As also shown, the slurry 104 composition with 2.00 ppm 2,3-dimethylpyridine provides for a Ge R.R. of about 3,366 Å/min and an Oxide R.R. of about 93 Å/min, resulting in about a 53% Ge R.R. improvement over the control slurry composition.

As another example, the sixth row of the table 400 illustrates a fifth example (Example 5) which includes 2,4-dimethylpyridine as the Ge removal rate enhancer. As shown, the slurry 104 composition with 500 ppm 2,4-dimethylpyridine provides for a Ge R.R. of about 3,388 Å/min and an Oxide R.R. of about 91 Å/min, resulting in about a 54% Ge R.R. improvement over the control slurry composition. As also shown, the slurry 104 composition with 2.00 ppm 2,4-dimethylpyridine provides for a Ge R.R. of about 3,674 Å/min and an Oxide R.R. of about 89 Å/min, resulting in about a 67% Ge R.R. improvement over the control slurry composition.

The seventh row of the table 400 illustrates a sixth example (Example 6) which includes 2,6-dimethylpyridine as the Ge removal rate enhancer. As shown, the slurry 104 composition with 500 ppm 2,6-dimethylpyridine provides for a Ge R.R. of about 3,366 Å/min and an Oxide R.R. of about 92 Å/min, resulting in about a 53% Ge R.R. improvement over the control slurry composition. As also shown, the slurry 104 composition with 2.00 ppm 2,6-dimethylpyridine provides for a Ge R.R. of about 3,564 Å/min and an Oxide R.R. of about 88 Å/min, resulting in about a 62% Ge R.R. improvement over the control slurry composition.

The eighth row of the table 400 illustrates a seventh example (Example 7) which includes 3,5-dimethylpyridine as the Ge removal rate enhancer. As shown, the slurry 104 composition with 500 ppm 3,5-dimethylpyridine provides for a Ge R.R. of about 2,310 Å/min and an Oxide R.R. of about 91 Å/min, resulting in about a 5% Ge R.R. improvement over the control slurry composition. As also shown, the slurry 104 composition with 2.00 ppm 3,5-dimethylpyridine provides for a Ge R.R. of about 2,354 Å/min and an Oxide R.R. of about 90 Å/min, resulting in about a 7% Ge R.R. improvement over the control slurry composition.

As described above, some embodiments of the slurry 104 may also include an etching inhibitor, for example, to further enhance CMP performance (e.g., reduced dishing). In some cases, such an etching inhibitor (e.g., provided by the etching inhibitor source 162) may include 2-mercaptopyridine N-oxide, although other etching inhibitors known in the art may also be used. Thus, in some embodiments and by way of example, the slurry 104 composition may include about 2,000 ppm colloidal silica, about 1,000 ppm $H_2O_2$, about 2,000 ppm 2-mercaptopyridine N-oxide, about 2,000 ppm of a methylpyridine compound or a methylpyridine derivative compound (described above), about 200 ppm polyethylene glycol, and have a pH level of about 3. In some embodiments, the etching inhibitor includes an etching inhibitor concentration of between approximately 100 ppm and 5,000 ppm.

Referring to FIG. 5, a table 500 shows a Ge R.R. (Å/min), an Oxide R.R. (Å/min), a germanium-to-oxide selectivity, and a Ge or SiGe recess depth in angstroms (Å) for embodiments of a slurry 104 composition employing an etch inhibitor (e.g., 2-mercaptopyridine N-oxide) without a Ge removal rate enhancer versus embodiments of the slurry 104 composition employing the etching inhibitor together with a Ge removal rate enhancer including a methylpyridine compound or a methylpyridine derivative compound. As used herein, the germanium-to-oxide selectivity is a unit-less quantity defined as a removal rate of Ge (or SiGe) divided by an oxide removal rate. For purposes of comparison, the first row of the table 500 shows data for a control slurry composition that does not include the etching inhibitor or the Ge removal rate enhancer. By way of example, the control slurry composition may include about 2,000 ppm colloidal silica, about 1,000 ppm $H_2O_2$, about 200 ppm polyethylene glycol, and have a pH level of about 3. As shown in the table 500, the control slurry composition has a Ge R.R. of about 2,200 Å/min, an Oxide R.R. of about 80 Å/min, and a Ge-oxide selectivity of about 27.5, resulting in a dishing recess of about 835 Å.

With reference now to the example slurry 104 compositions having an etching inhibitor without a Ge removal rate enhancer, the second row of the table 500 illustrates a first example (Example 1) which includes 2-mercaptopyridine N-oxide as the etching inhibitor. As shown, the slurry 104 composition which includes 2-mercaptopyridine N-oxide as the etching inhibitor, and which does not include a Ge removal rate enhancer, provides for a Ge R.R. of about 1,845 Å/min, an Oxide R.R. of about 28 Å/min, and a Ge-oxide selectivity of about 65, resulting in a recess of about 100 Å. Thus, as compared to the control slurry composition, the slurry composition of Example 1 shows an improved Ge-oxide selectivity and a reduced recess; however, the Ge R.R. is lower than the control slurry composition. Thus, it would be desirable to add the Ge removal rate enhancer to slurry 104 compositions containing the etching inhibitor, for example, to improve the Ge R.R. while maintaining the improved Ge-oxide selectivity and reduced dishing recess.

By way of example, the third row of the table 500 illustrates a second example (Example 2) which includes 2-mercaptopyridine N-oxide as the etching inhibitor and 2,000 ppm 2-methylpyridine as the Ge removal rate enhancer. As shown, the slurry 104 composition of Example 2 provides for a Ge R.R. of about 3,044 Å/min, an Oxide R.R. of about 50 Å/min, and a Ge-oxide selectivity of about 60, resulting in a recess of about 95 Å. Thus, as compared to the slurry composition of Example 1 which does not include the Ge removal rate enhancer, the slurry composition of Example 2 exhibits an improved Ge-oxide selectivity and a reduced recess (i.e., reduced dishing) as well as an enhanced Ge R.R. that is greater than the control slurry composition Ge R.R. While the slurry composition of Example 2 has been shown and described to include 2-methylpyridine, it will be understood that any of the other Ge removal rate enhancers (e.g., 3-methylpyridine; 4-methylpyridine; 2,3-dimethylpyridine; 2,4-dimethylpyridine; 2,6-dimethylpyridine; and 3,5-dimethylpyridine) may also be used without departing from the scope of the present disclosure. In a similar manner, other etching inhibitors as known in the art may also be used without departing from the scope of the present disclosure.

The various slurry 104 compositions described above, including the example compounds and slurry compositions shown in FIGS. 2-5, may provide for a high Ge- or SiGe-to-dielectric material selectivity along with a low rate of Ge or SiGe recess formation. Among other benefits and advantages, the slurry 104 compositions described herein including the Ge removal rate enhancer provide for a high polishing throughput, a low rate of Ge or SiGe recess formation, and an enhanced pot-life (i.e., time period during which the slurry composition retains its efficacy).

Figure 6:
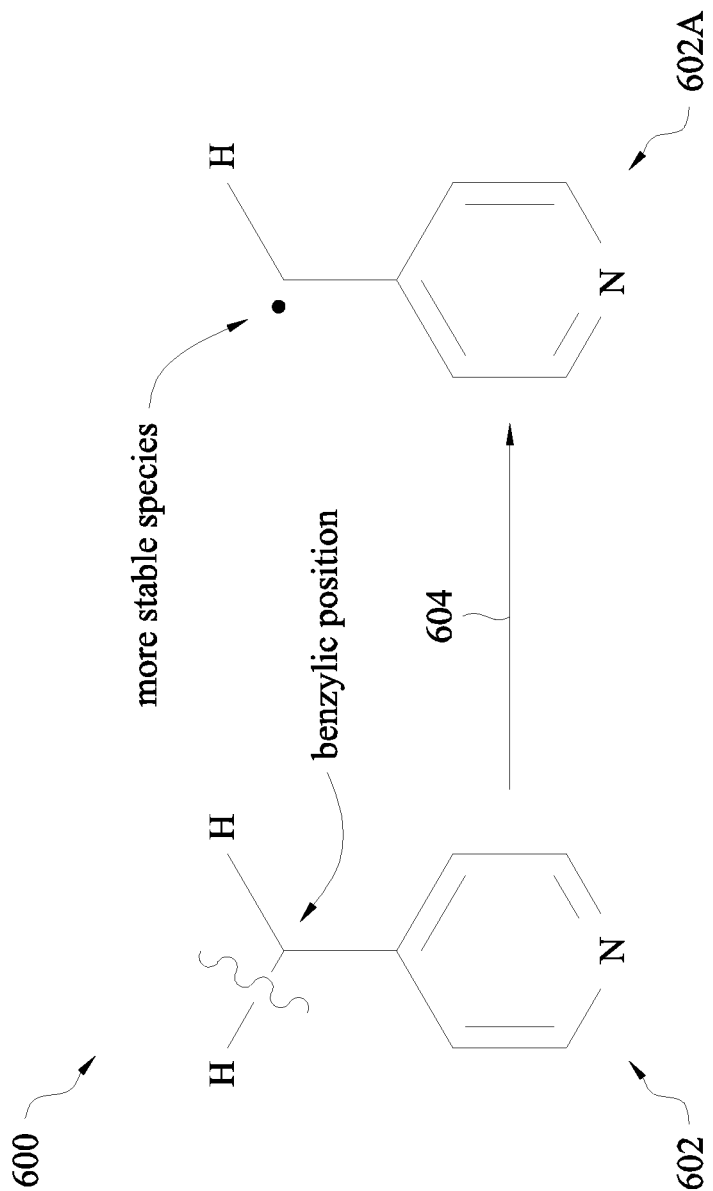
FIG. 6 illustrates an example of a mechanism by which embodiments of the CMP slurry provide their described functionality.

Referring now to FIG. 6, an example of a mechanism 600 by which embodiments of the slurry 104 composition provide their described functionality is illustrated. The methylpyridine and methylpyridine derivative compounds described herein are understood to act, in various embodiments, as reagents which serve to improve the Ge removal rate. As shown in FIG. 6, a methylpyridine (or methylpyridine derivative) compound 602 may include one or more hydrogen atoms or hydroxyl radicals at the benzylic position (i.e., adjacent to the benzene ring). In general, functional groups disposed at a benzylic position are more reactive than their related isolated functional groups. In some embodiments, a reaction 604 results in the methylpyridine (or methylpyridine derivative) compound 602A which includes a more stable species (e.g., compared to a hydroxyl radical). Such a reaction may, for example, help to oxidize Ge or SiGe or may form a complex with Ge or SiGe, which can enhance the dissociation rate of the oxidant. In some examples, methylpyridine or its derivatives may not directly enhance the dissociation rate of the oxidant because the methylpyridine or methylpyridine derivatives may co-exist with the oxidant.

Figure 7:
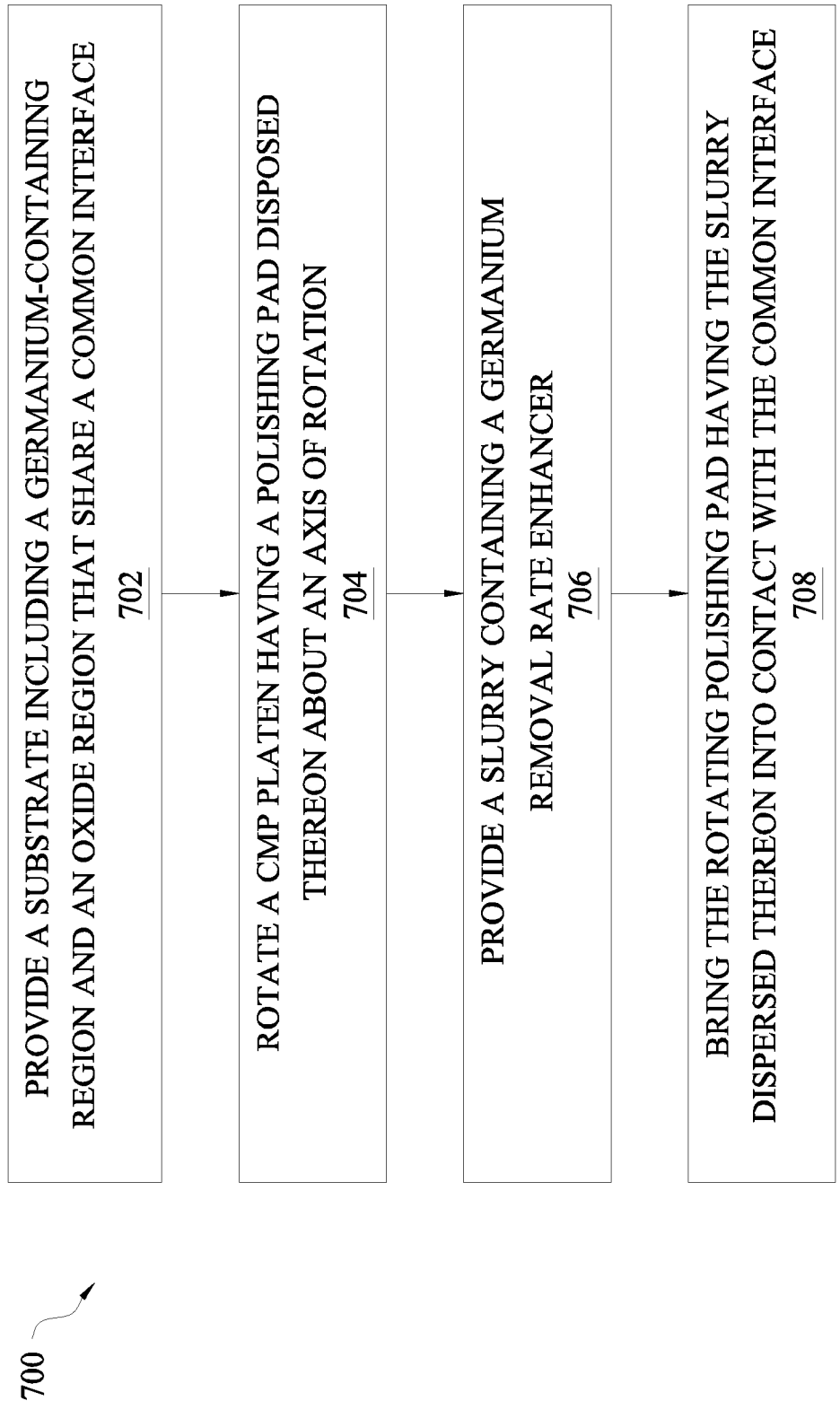
FIG. 7 is a flow chart of a method of performing a CMP process according to one or more aspects of the present disclosure.

Referring now to FIG. 7, illustrated therein is a method 700 of a CMP process in accordance with one or more of the embodiments described herein. In various examples, the method 700 includes a CMP process having a high Si- or SiGe-oxide selectivity and a low rate of Ge or SiGe recess formation. It is understood that the method 700 may include additional steps performed before, after, and/or during the method 700. It is understood that the process steps of method 700 are merely exemplary and are not intended to be limiting beyond what is specifically recited in the claims that follow.

The method 700 begins at block 702 where a substrate including a Ge-containing region and an oxide region, that share a common interface, is provided. By way of example, the substrate may include the substrate 112. In addition, the Ge-containing region and an oxide region which share the common interface may include the one or more layers 118, which directly face the rotating polishing pad 106. The Ge-containing region may include a SiGe layer having anywhere between a 15% Ge concentration and 100% Ge concentration (i.e., pure Ge). The oxide region may include silicon dioxide or other oxide and/or dielectrics as known in the art. The method 700 proceeds to block 704 where a CMP platen having a polishing pad disposed thereon is rotated about an axis of rotation. For example, the polishing pad 106 on the platen 108 may be rotated about the axis of rotation 110 during operation of the CMP system 100. The method then proceeds to block 706 where a slurry containing a Ge removal rate enhancer is provided. By way of example, the slurry source 102 may distribute the slurry 104 containing the Ge removal rate enhancer onto the surface of the polishing pad 106, where the rotation of the polishing pad 106 transports the slurry 104 underneath the substrate 112. The method 700 the proceeds to block 708 where the rotating polishing pad 106, having the slurry 104 with the Ge removal rate enhancer dispersed thereon, is brought into contact with the Ge-containing region/oxide region common interface of the substrate 112. Upon being brought into contact with the polishing pad 106, the substrate 112 is polished. In accordance with aspects of the present disclosure, the substrate 112 polishing using a slurry having the Ge removal rate enhancer provides for a CMP process with a high polishing throughput, a high Si- or SiGe-to-oxide selectivity, and a low rate of Ge or SiGe recess formation. In addition, in some examples, the slurry used for the CMP process of the method 700 may further include an etching inhibitor, which together with the Ge removal rate enhancer, may further improve the quality of the CMP process (e.g., by further reduction of dishing/recessing while maintaining a high Ge removal rate).

Figure 8:
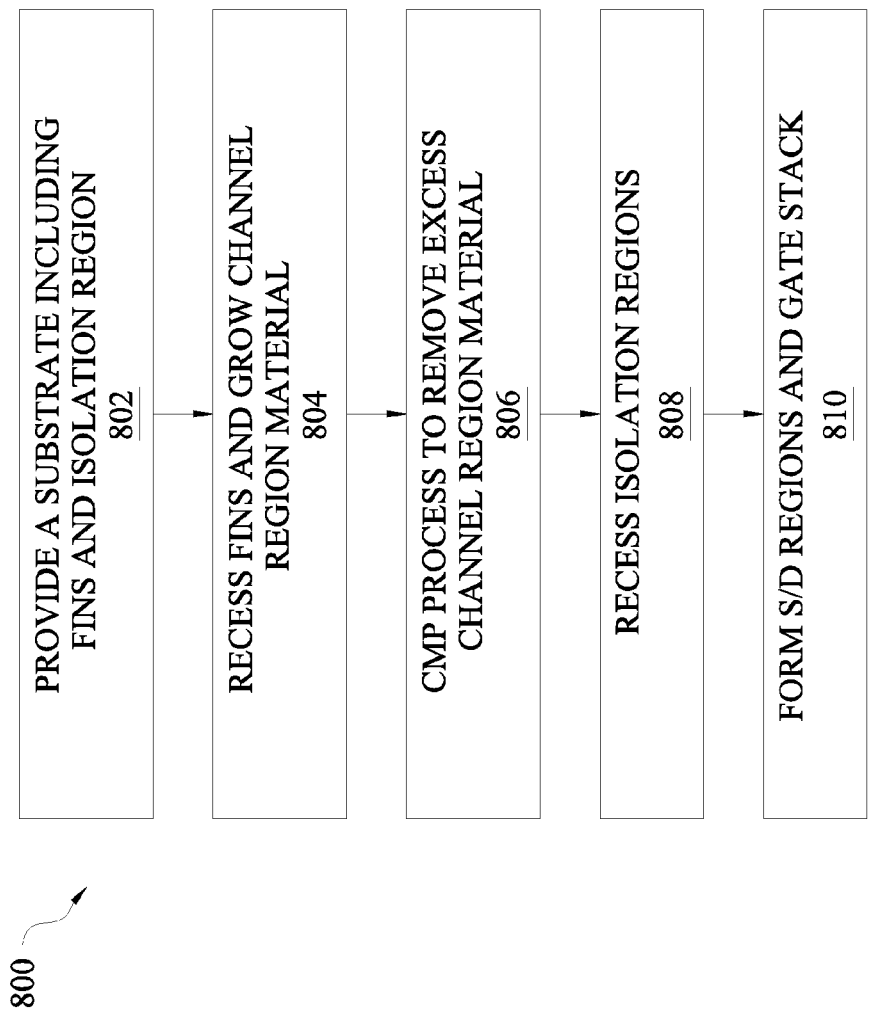
FIG. 8 is a flow chart of a method of fabricating a semiconductor device including performing a CMP process according to one or more aspects of the present disclosure.
Figure 11:
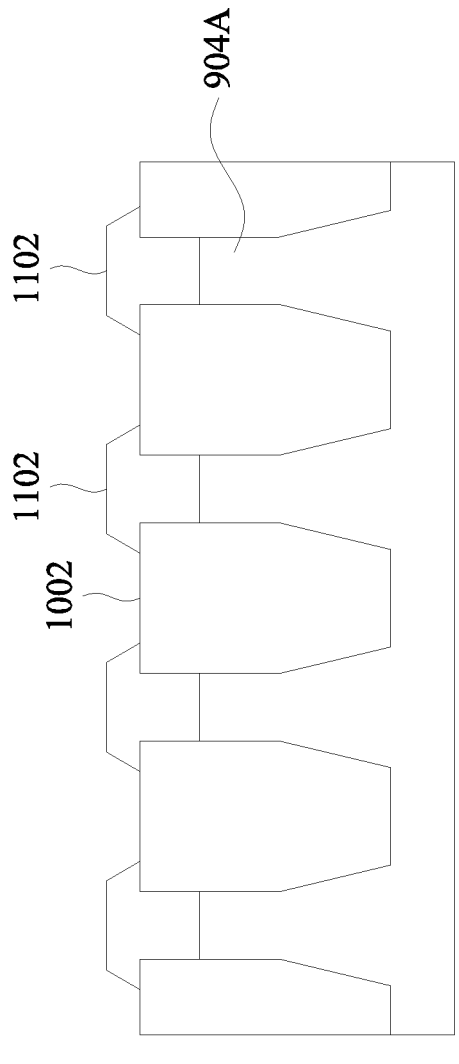
Figure 12:
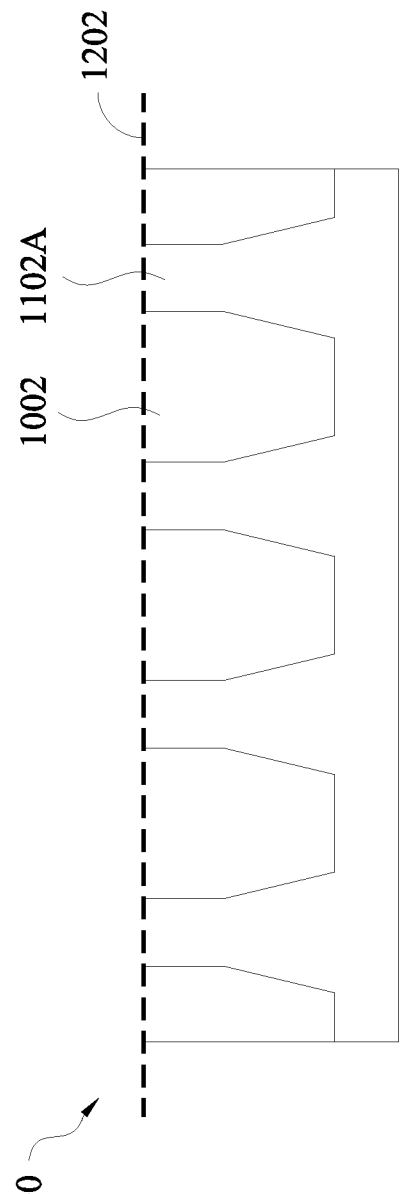
Figure 13:
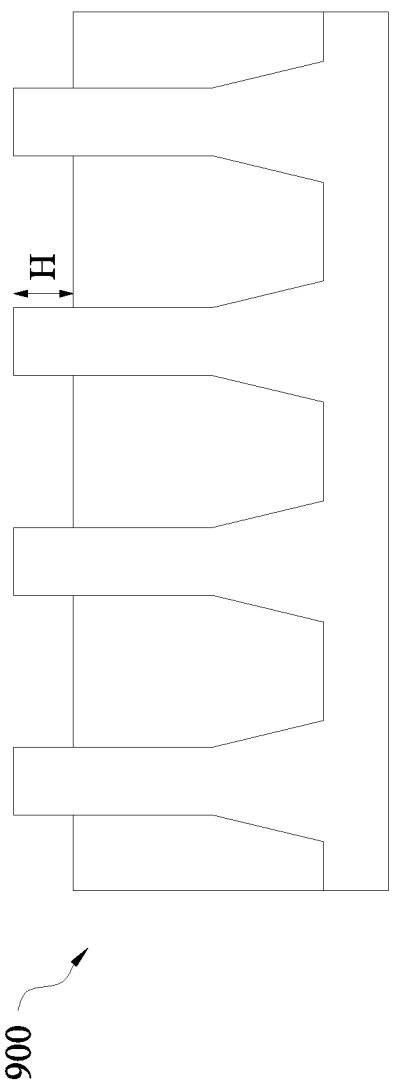

Referring now to FIG. 8, illustrated therein is a method 800 of semiconductor device fabrication including fabrication of a Ge or SiGe FinFET device using a CMP process with a high polishing throughput, high Si- or SiGe-oxide selectivity, and a low rate of Ge or SiGe recess formation. It is understood that the method 800 includes steps having features of a complementary metal-oxide-semiconductor (CMOS) technology process flow and thus, are only described briefly herein. Additional steps may be performed before, after, and/or during the method 800.

Figure 14:
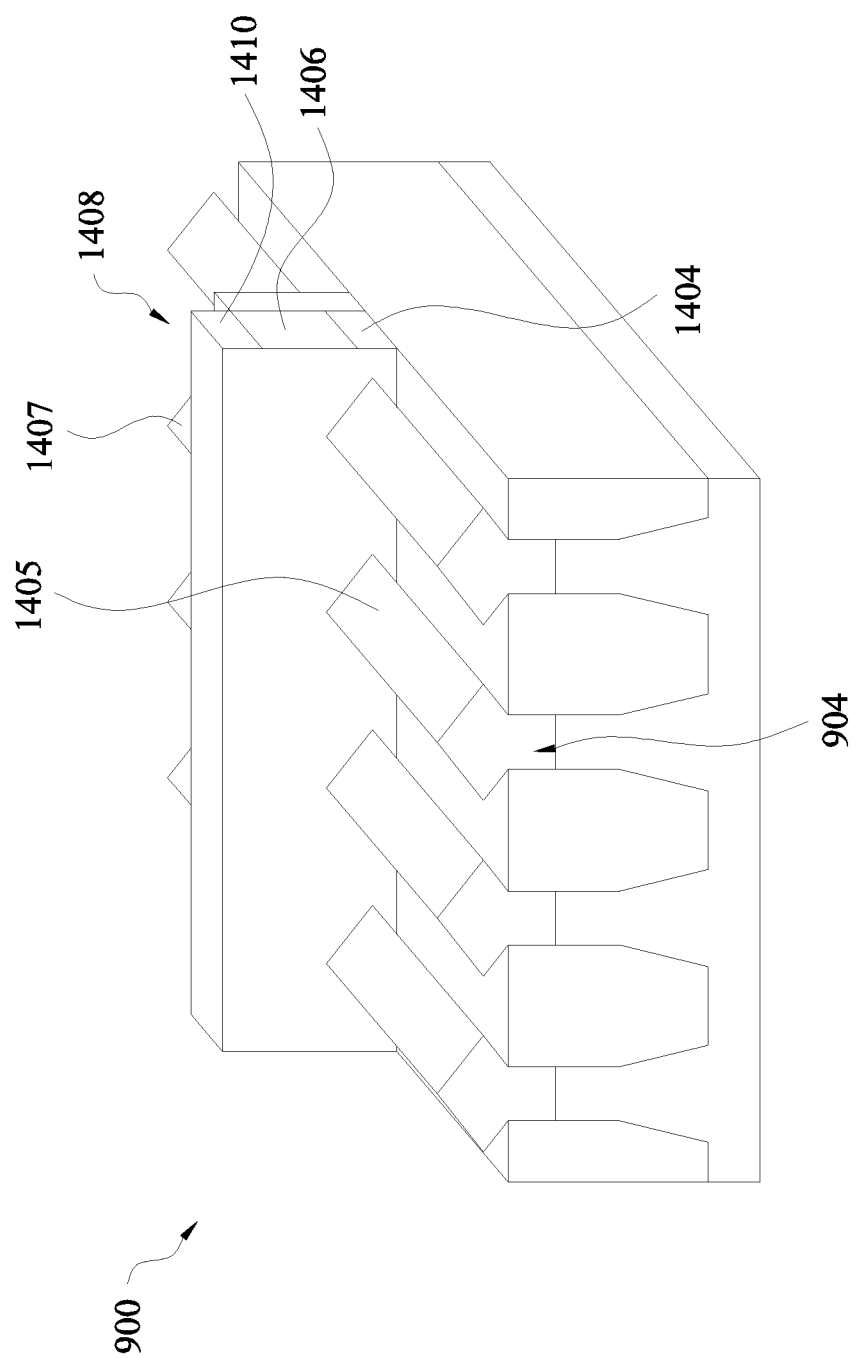
FIG. 14 illustrates a perspective view of an embodiment of a semiconductor device at a stage of the method of FIG. 8.

FIGS. 9-13 are cross-section views, and FIG. 14 is a perspective view, of an embodiment of a semiconductor device 900 according to various stages of the method 800 of FIG. 8. It is understood that the semiconductor device 900 may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the semiconductor device 900 includes a plurality of semiconductor devices (e.g., transistors), including PFETs, NFETs, etc., which may be interconnected. Moreover, it is noted that the process steps of method 800, including any descriptions given with reference to FIGS. 9-14, are merely exemplary and are not intended to be limiting beyond what is specifically recited in the claims that follow.

Referring now to the method 800, the method 800 begins at block 802 where a substrate including fins and isolation regions is provided. In some embodiments, the substrate may be a semiconductor substrate such as a silicon substrate. The substrate may include various layers, including conductive or insulating layers formed on a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, the substrate may optionally include an epitaxial layer (epi-layer), may be strained for performance enhancement, may include a silicon-on-insulator (SOI) structure, and/or have other suitable enhancement features.

In various embodiments, the substrate includes a plurality of fins extending therefrom. The fins, like the substrate, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the making element may be performed using an electron beam (e-beam) lithography process. The masking element may then be used to protect regions of the substrate while an etch process forms recesses into the silicon layer, thereby leaving an extending fin. The recesses may be etched using a dry etch (e.g., reactive ion etching), a wet etch, and/or other suitable processes. Numerous other embodiments of methods to form the fins on the substrate may also be used.

As an example of block 802, and with reference to the example of FIG. 9, illustrated is a semiconductor device 900 including a semiconductor substrate 902 and fins 904, which may be patterned and etched as described above. In some embodiments, a pad oxide layer (e.g., $SiO_2$) and a pad nitride layer (e.g., $Si_3N_4$) may also be formed over the fins 904. Formation of the fins 904 also defines trenches 906 disposed between the fins 904. The trenches 906 are subsequently used to form isolation regions, such as STI isolation regions 1002 illustrated in FIG. 10. Such isolation regions 1002 may be formed by dielectric deposition over the substrate 902, which fills the trenches 906, followed by a CMP process to remove excess dielectric material, planarize a top surface of the semiconductor device 900, and thereby form the isolation regions 1002 between adjacent fins 904.

In some embodiments, one or more well implants may be performed, for example using an ion implantation process and employing a suitable N-type or P-type dopant in order to dope the fins 904 (e.g., to dope a fin well region). In some embodiments the N-type dopant includes arsenic, phosphorous, antimony, or other N-type donor material. In some embodiments, the P-type dopant includes boron, aluminum, gallium, indium, or other P-type acceptor material. In some embodiments, similar N-type or P-type dopants may be used to perform anti-punch through (APT) ion implantation through the fins 904. In some embodiments, other ion implant processes may also be performed, such as a threshold voltage ($V_t$) adjust implant, a halo implant, or other suitable implant. After an ion implantation process, the semiconductor device 900 may be subjected to a high temperature anneal, for example greater than approximately 800° C., in order to remove defects and activate dopants (i.e., to place dopants into substitutional sites).

The method 800 proceeds to block 804 where the fins are recessed and a channel region material is grown within the recessed fin regions. By way of example, and with reference to FIG. 10, a top portion of the fins 904 is recessed, resulting in recessed fins 904A. The recessing process may include a dry etching process, a wet etching process, and/or a combination thereof. Continuing the example of block 804 of the method 800, and referring now to FIG. 11, a device channel region material 1102 (e.g., a FinFET device channel region material) is formed over an end portion of recessed fins 904A. In some embodiments, the channel region material 1102 includes a $Si_{1-x}Ge_x$ layer, where the germanium content 'x' may be in a range of approximately 15% to approximately 100% (pure Ge). In some embodiments, the channel region material 1102 may include a material having a different composition than a composition of the recessed fins 904A on which the channel region material 1102 is formed, which may result in strain within the channel region material 1102. In some examples, the channel region material 1102 may include a material having the same or similar composition as the composition of the recessed fins 904A on which the channel region material 1102 is formed. In some embodiments, channel region material 1102 is deposited using EPI, CVD, PVD, ALD, or other suitable process.

The method 800 proceeds to block 806 wherein a CMP process is performed to remove excess channel region material and planarize a top surface of the device. By way of example, and with reference to FIG. 12, a CMP process is performed using a CMP slurry having a Ge removal rate enhancer that provides for a high Ge-oxide selectivity with a low rate of recess formation in the $Si_{1-x}Ge_x$ channel region material 1102. As shown, the CMP process removes excess channel region material 1102 from the substrate, resulting in channel region material 1102A, and forms a substantially planar surface along dashed line 1202. Since the slurry provides for a high Ge-oxide selectivity, as described above, the Ge or SiGe channel region material 1102 is removed from the semiconductor substrate at a higher rate than the oxide of the STI isolation regions 1002, resulting in a substantially flat top surface of the device 900.

The method 800 proceeds to block 808 the isolation regions are recessed. In an embodiment of block 808, and with reference to FIG. 13, the STI isolation regions 1002 (FIGS. 10-12) around the fins are recessed by a height 'H'. In some embodiments, recessing of the STI isolation regions 1002 laterally exposes an upper portion of the fins. The STI recessing process may include a dry etching process, a wet etching process, and/or a combination thereof, which may be appropriately selected for a desired recess height 'H'.

The method 800 proceeds to block 810 where source drain regions and a gate stack are formed. By way of example, and with reference to the example of FIG. 14, a source region 1405 and a drain region 1407 are formed in, on, and/or surrounding the fins 904. The source/drain regions 1405, 1407 may be epitaxially grown over the fins 904. In various embodiments, a transistor channel region, including the channel region material 1102A, is disposed within the fins 904 and underlying a gate structure 1408.

Continuing with the example of block 810, the gate structure 1408 includes a high-K/metal gate stack. Additionally, the gate structure 1408 includes an interfacial layer 1404 formed over the channel region material 1102A of the fin, a high-K gate dielectric layer 1406 formed over the interfacial layer 1404, and a metal layer 1410 formed over the high-K gate dielectric layer 1406. High-K gate dielectrics, as used and described herein, include dielectric material having a high dielectric constant, for example, greater than that of thermal silicon oxide (~3.9). The metal layer used within high-K/metal gate stack may include a metal, metal alloy, or metal silicide. Additionally, the formation of the gate structure 1408 includes depositions to form various gate materials and one or more CMP processes to remove excessive gate materials and thereby planarize a top surface of the semiconductor device 900.

The interfacial layer 1404 may include a dielectric material such as silicon oxide ($SiO_2$), HfSiO, or silicon oxynitride (SiON). The high-K gate dielectric layer 1406 may include a high-K dielectric layer such as hafnium oxide ($HfO_2$). Alternatively, the high-K gate dielectric layer 1406 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The metal layer 1410 of the gate structure 1408 may include a single layer or alternatively a multi-layer structure, such as various combinations of a metal layer with a selected work function to enhance the device performance (work function metal layer), liner layer, wetting layer, adhesion layer, metal alloy or metal silicide. By way of example, the metal layer 1410 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In some embodiments, the metal layer 1410 may be formed separately for N-FET and P-FET transistors which may use different metal layers. In various embodiments, a CMP process may be performed to remove excessive metal from the metal layer 1410 and thereby provide a substantially planar top surface of the metal layer 1410 of the gate structure 1408.

The semiconductor device 900 may undergo further processing to form various features and regions known in the art. For example, subsequent processing may form various contacts/vias/lines and multilayers interconnect features (e.g., metal layers and interlayer dielectrics) on the substrate, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Moreover, additional process steps may be implemented before, during, and after the method 800, and some process steps described above may be replaced or eliminated in accordance with various embodiments of the method 800. With respect to the description provided herein, the present disclosure offers an improved CMP slurry composition, as well as methods for using such composition, which provides for a high Ge- or SiGe-to-dielectric material selectivity along with a low rate of Ge or SiGe recess formation. As described above, the disclosed slurry composition may include an oxidant and a Ge removal rate enhancer. In some embodiments, the slurry composition may also include an etching inhibitor. In some embodiments, the oxidant includes a compound having one or more oxygen molecules. In some embodiments, the Ge removal rate enhancer includes a methylpyridine compound or a methylpyridine derivative compound. In the various embodiments described herein, the slurry compositions including the Ge removal rate enhancer provides a high polishing throughput (e.g., via high Ge or SiGe removal), a low rate of Ge or SiGe recess formation, and an enhanced pot-life (i.e., time period during which the slurry composition retains its efficacy). Those of skill in the art will readily appreciate that the methods and structures described herein may be applied to a variety of other semiconductor processes and/or devices to advantageously achieve similar benefits from such other processes and/or devices without departing from the scope of the present disclosure.

Thus, one of the embodiments of the present disclosure described a slurry composition including an oxidant having a compound with one or more oxygen molecules, and a germanium removal rate enhancer. The germanium removal rate enhancer includes at least one of a methylpyridine compound and a methylpyridine derivative compound. By way of example, the oxidant may include at least one of hydrogen peroxide, potassium peroxodisulfate, ammonium peroxodisulfate, sodium peroxodisulfate, potassium peroxymonosulfate, peracetic acid, and tert-butyl hydrogen peroxide. Also, by way of example, the germanium removal rate enhancer includes at least one of 2-methylpyridine, 3-methylpyridine, 4-methylpyridine, 2,3-dimethylpyridine, 2,4-dimethylpyridine, 2,6-dimethylpyridine, and 3,5-dimethylpyridine.

In another of the embodiments, discussed is a CMP system which includes a slurry source, a polishing pad, and a workpiece carrier. In some embodiments, the slurry source is configured to distribute a slurry having a slurry composition including an oxidant and a germanium removal rate enhancer. The germanium removal rate enhancer includes at least one of a methylpyridine compound and a methylpyridine derivative compound. In some examples, the polishing pad is disposed on a platen that is configured to rotate, and the slurry source is configured to distribute the slurry onto a surface of the polishing pad. In some embodiments, the workpiece carrier is configured to house a substrate and bring the substrate into contact with the polishing pad, thereby polishing the substrate.

In yet another of the embodiments, discussed is a method which includes providing a substrate having a germanium-containing region and an oxide region. In some embodiments, the germanium-containing region and the oxide region share a common interface. The CMP platen including a polishing pad disposed thereon is rotated. In various embodiments, a slurry containing an oxidant and a germanium removal rate enhancer is provided onto a surface of the polishing pad. The rotating polishing pad, having the slurry thereon, is put in contact with the common interface of the germanium-containing region and the oxide region, thereby polishing the common interface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising: providing a substrate including a germanium-containing region and an oxide region, wherein the germanium-containing region and the oxide region share a common interface; rotating a chemical mechanical polishing (CMP) platen including a polishing pad disposed thereon; providing a slurry containing an oxidant including a first compound, a germanium removal rate enhancer including a second compound comprising at least one methyl group, and an abrasive onto a surface of the polishing pad during the rotating; and contacting the polishing pad having the slurry thereon to the common interface of the germanium-containing region and the oxide region.

2. The method of claim 1, further comprising:
after contacting the rotating polishing pad to the common interface, polishing the common interface, wherein the polishing is configured to remove material from the germanium-containing region at a higher rate than from the oxide region, and wherein the common interface of the germanium-containing region and the oxide region is substantially flat after polishing.

3. The method of claim 1, wherein the germanium removal rate enhancer includes at least one of 2-methylpyridine, 3-methylpyridine, 4-methylpyridine, 2,3-dimethylpyridine, 2,4-dimethylpyridine, 2,6-dimethylpyridine, and 3,5-dimethylpyridine.

4. The method of claim 3, wherein the oxidant includes one or more of hydrogen peroxide, potassium peroxodisulfate, ammonium peroxodisulfate, sodium peroxodisulfate, potassium peroxymonosulfate, peracetic acid, and tert-butyl hydrogen peroxide.

5. The method of claim 1, wherein the providing the slurry further includes providing at least one of an etching inhibitor, a surfactant, an organic complexant, a chelating agent, an organic or inorganic acid, an organic or inorganic base, a corrosion inhibitor, and a buffer.

6. A method, comprising:
providing a substrate including a germanium-containing region and a second region, wherein the germanium-containing region and the second region share a common interface;
rotating a chemical mechanical polishing (CMP) platen including a polishing pad disposed thereon;
providing a slurry containing a germanium removal rate enhancer onto a surface of the polishing pad during the rotating, the germanium removal rate enhancer including at least one of a methylpyridine compound and a methylpyridine derivative compound; and
contacting the polishing pad having the slurry thereon to the common interface of the germanium-containing region and the oxide region.

7. The method of claim 6 wherein the second region is an oxygen-containing region, the slurry further containing an oxidant having one or more oxygen atoms.

8. The method of claim 7 wherein comprising:
providing an abrasive including at least one of colloidal silica, fumed silica, aluminum oxide, silica shell based composite submicron particles, and ceria, to the slurry.

9. The method of claim 7 further comprising
providing at least one of a surfactant, an organic complexant, a chelating agent, an organic or inorganic acid, an organic or inorganic base, a corrosion inhibitor, and a buffer to the slurry.

10. The method of claim 7 wherein the slurry composition includes a slurry composition having a pH level in a range of between approximately 1 and 6.

11. The method of claim 7 wherein the oxidant includes one or more of hydrogen peroxide, potassium peroxodisulfate, ammonium peroxodisulfate, sodium peroxodisulfate, potassium peroxymonosulfate, peracetic acid, and tert-butyl hydrogen peroxide.

12. The method of claim 7 wherein the oxidant includes an oxidant concentration between approximately 10 ppm and 50,000 ppm.

13. The method of claim 6 wherein the germanium removal rate enhancer includes the methylpyridine compound including at least one of 2-methylpyridine, 3-methylpyridine, and 4-methylpyridine.

14. The method of claim 6 wherein, wherein the germanium removal rate enhancer includes the methylpyridine derivative compound including at least one of 2,3-dimethylpyridine, 2,4-dimethylpyridine, 2,6-dimethylpyridine, and 3,5-dimethylpyridine.

15. The method of claim 6 wherein the germanium removal rate enhancer includes a germanium removal rate enhancer concentration between approximately 100 ppm and 5,000 ppm.

16. The method of claim 6 further comprising:
providing an etching inhibitor to the slurry.

17. The method of claim 16 wherein the etching inhibitor includes 2-mercaptopyridine N-oxide.

18. The method of claim 16 wherein the etching inhibitor includes an etching inhibitor concentration of between approximately 100 ppm and 5,000 ppm.

19. A method for chemical mechanical polishing (CMP) a workpiece, comprising:
distributing a slurry having a slurry composition including an oxidant and a germanium removal rate enhancer, wherein the germanium removal rate enhancer includes at least one of a methylpyridine compound and a methylpyridine derivative compound; and
rotating a polishing pad disposed on a platen relative to a substrate, wherein the slurry is distributed onto a surface of the polishing pad; and
positioning the workpiece adjacent with the polishing pad.

20. The method of claim 19, wherein the germanium removal rate enhancer includes the methylpyridine compound including at least one of 2-methylpyridine, 3-methylpyridine, and 4-methylpyridine.

* * * * *